US009154167B1

(12) United States Patent  
Lee et al.

(10) Patent No.: US 9,154,167 B1  
(45) Date of Patent: Oct. 6, 2015

(54) RADIO FREQUENCY TRANSMITTING DEVICE AND RADIO FREQUENCY RECEIVING DEVICE

(71) Applicant: NATIONAL TAIWAN UNIVERSITY, Taipei (TW)

(72) Inventors: Jr-I Lee, Taipei (TW); Pen-Jui Peng, New Taipei (TW); Pang-Ning Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 14/322,886

(22) Filed: Jul. 2, 2014

(30) Foreign Application Priority Data

Jun. 3, 2014 (TW) .............................. 103119224 A

(51) Int. Cl.
*H04B 1/00* (2006.01)
*H04B 1/04* (2006.01)
*H03F 3/19* (2006.01)
(Continued)

(52) U.S. Cl.
CPC .. *H04B 1/04* (2013.01); *H03F 3/19* (2013.01); *H03F 3/21* (2013.01); *H03F 3/245* (2013.01); *H04B 1/16* (2013.01); *H03F 2200/451* (2013.01)

(58) Field of Classification Search
CPC ............ H04B 1/04; H04B 1/16; H04B 1/027; H01Q 3/267; H01Q 21/0093; H01Q 21/065; H01Q 25/00
USPC ............... 455/63.1, 67.13, 110, 114.2, 127.2, 455/127.3, 272, 273, 276.1, 296, 313
See application file for complete search history.

(56) References Cited

U.S. PATENT DOCUMENTS 6,862,442 B2 * 3/2005 Sanada ................ H04B 7/0885
455/313
7,477,103 B2 * 1/2009 Brueske .................. H03F 3/189
330/257

(Continued)

FOREIGN PATENT DOCUMENTS

CN 103051575 A 4/2013
EP 2253081 A1 11/2010
TW 201412066 A 3/2014

OTHER PUBLICATIONS

Shih-Jou Huang et al., "A Fully-Integrated 77GHz Phase-Array Radar System with 1TX/4RX Frontend and Digital Beamforming Technique," 2013 Symposium on VLSI Circuits Digest of Technical Papers, pp. 294-295, Jun. 2013.

(Continued)

*Primary Examiner* — Quochien B Vuong
(74) *Attorney, Agent, or Firm* — CKC & PARTNERS CO., LTD.

(57) ABSTRACT

A radio frequency transmitting device includes a frequency multiplier circuit, a mixer circuit, a power splitter, a plurality of phase shifting circuits, a plurality of amplifiers, and a plurality of antennas. The frequency multiplier circuit is configured to amplify a fundamental signal to generate a harmonic signal. The mixer circuit is configured to generate a RF signal based on an input signal and the harmonic signal. The power splitter is configured to generate a plurality of sub-RF signals. The phase shifting circuits are configured to shift the phase of the sub-RF signals. The amplifiers are configured to amplify the power of the sub-RF signals. The antennas are configured to transmit the sub-RF signals. Furthermore, a radio frequency receiving device is also disclosed herein.

10 Claims, 11 Drawing Sheets

(51) Int. Cl.
*H03F 3/24* (2006.01)
*H03F 3/21* (2006.01)
*H04B 1/16* (2006.01)

(56) References Cited

U.S. PATENT DOCUMENTS 8,149,806 B2  4/2012  Kesselman et al.
8,385,841 B2 * 2/2013  Nezhad-Ahmadi ..... H04L 27/10
                                                        455/86
8,406,721 B2 * 3/2013  Rofougaran ............. H04B 7/04
                                                        455/63.1
8,712,466 B2 * 4/2014  Martineau ................ H01P 5/12
                                                        455/550.1

OTHER PUBLICATIONS

Pang-Ning Chen et al., "A 94GHz 3D-Image Radar Engine with 4TX/4RX Beamforming Scan Technique in 65nm CMOS," IEEE International Solid-State Circuits Conference, pp. 146-147, Feb. 2013.

* cited by examiner

RADIO FREQUENCY TRANSMITTING DEVICE AND RADIO FREQUENCY RECEIVING DEVICE

RELATED APPLICATIONS

This application claims priority to Taiwanese Application Serial Number 103119224, filed Jun. 3, 2014, which is herein incorporated by reference.

BACKGROUND

1. Field of Invention

The present invention relates to wireless communication technology. More particularly, the present invention relates to a radio frequency (RF) transmitting device and a radio frequency receiving device.

2. Description of Related Art

With progression of technology, transmission ways among electrical elements change from wire connection (for example: transmitting through Universal Serial Bus (USB)) into wireless connection so as to improve inconvenience resulted by wire connection.

However, there are many problems resulted by wireless connection. For example, linearity of signals transmitted by a radio frequency transmission device and AM/AM distortion. In addition, matching problems and linearity are existed in a variable gain amplifier of a radio frequency transmitting device with bias tuning technology or current steering technology.

In view of the foregoing, there exist problems and disadvantages in the existing products that await further improvement. However, those skilled in the art sought vainly for a solution.

SUMMARY

The following summary presents a simplified summary of the disclosure in order to provide a basic understanding to the reader. This summary is not an extensive overview of the disclosure and it does not identify key/critical elements of the present invention or delineate the scope of the present invention.

One aspect of the present disclosure is directed to a radio frequency transmitting device. The radio frequency transmitting device includes a frequency multiplier circuit, a mixer circuit, a power splitter, a plurality of phase shifting circuits, a plurality of amplifiers, and a plurality of antennas. The frequency multiplier circuit is configured to amplify a frequency of a fundamental signal to generate a harmonic signal. The mixer circuit is configured to be electrically coupled to the frequency multiplier circuit, and configured to generate a radio frequency signal according to an input signal and the harmonic signal. The power splitter is configured to be electrically coupled to the mixer circuit, and configured to generate a plurality of sub-radio-frequency signals according to the radio frequency signal. The power splitter comprises a first amplifier, a plurality of second amplifiers, and a plurality of third amplifiers. The second amplifiers are configured to be connected between a common node and a power source in parallel, wherein the common node is electrically coupled to the first amplifier. The third amplifiers are configured to be electrically coupled to the second amplifiers respectively. The phase shifting circuits are configured to shift phases of the sub-radio-frequency signals respectively. The amplifiers are configured to amplify power of the sub-radio-frequency signals respectively. Each of the amplifiers comprises an input stage, a first coupler, a plurality of fourth amplifiers, a power detector, and a voltage damper. The input stage is configured to receive the sub-radio-frequency signal. The first coupler is configured to be electrically coupled to the input stage. The fourth amplifiers are connected to each other in series and electrically coupled to the first coupler, wherein the first coupler is configured to couple part of power of the sub-radio-frequency signal to the fourth amplifiers, and the fourth amplifiers are configured to amplify power of the sub-radio-frequency signal according to a bias. The power detector is configured to be electrically coupled to the first coupler, wherein the first coupler is configured to couple part of power of the sub-radio-frequency signal to the power detector, and the power detector is configured to detect the sub-radio-frequency signal to output a detection signal. The voltage clamper is configured to be electrically coupled to the power detector, and configured to control the bias according to the detection signal. The antennas are configured to transmit the sub-radio-frequency signals.

Another aspect of the present disclosure is directed to radio frequency receiving device. The radio frequency receiving device includes a plurality of antennas, a plurality of variable gain low noise amplifiers, a plurality of phase shifting circuits, a frequency multiplier circuit, and a mixer circuit. The antennas are configured to receive a plurality of radio frequency signals. The variable gain low noise amplifiers are configured to be electrically coupled to the antennas, and configured to amplify the radio frequency signals. Each of the variable gain low noise amplifiers comprises an input stage and a plurality of variable gain amplifiers. The input stage is configured to filter noise of the radio frequency signals. The variable gain amplifiers are connected to each other in series, and configured to be electrically coupled to the input stage. Each of the variable gain amplifiers comprises an amplifying unit and a pull down unit. The amplifying unit is configured to amplify power of the radio frequency signals. The pull down unit is configured to be electrically coupled to the amplifying unit, and configured to connect the amplifying unit to ground according to a control signal. The phase shifting circuits are configured to be electrically coupled to the variable gain low noise amplifiers respectively, and configured to shift phases of the radio frequency signals. The frequency multiplier circuit is configured to amplify a frequency of a fundamental signal to generate a harmonic signal. The mixer circuit is configured to be electrically coupled to the phase shifting circuits and the frequency multiplier circuit, and configured to generate an output signal according to the radio frequency signals and the harmonic signal.

In view of the foregoing, embodiments of the present disclosure provide a radio frequency transmitting device and a radio frequency receiving device to improve linearity of signals transmitted by a wireless transmission device and AM/AM distortion. In addition, the radio frequency receiving device of the present invention improves matching problems and linearity existed in a variable gain amplifier with bias tuning technology or current steering technology.

These and other features, aspects, and advantages of the present invention, as well as the technical means and embodiments employed by the present invention, will become better understood with reference to the following description in connection with the accompanying drawings and appended claims.

BRIEF DESCRIPTION OF THE DRAWINGS

The invention can be more fully understood by reading the following detailed description of the embodiment, with reference made to the accompanying drawings as follows.

Figure 1:
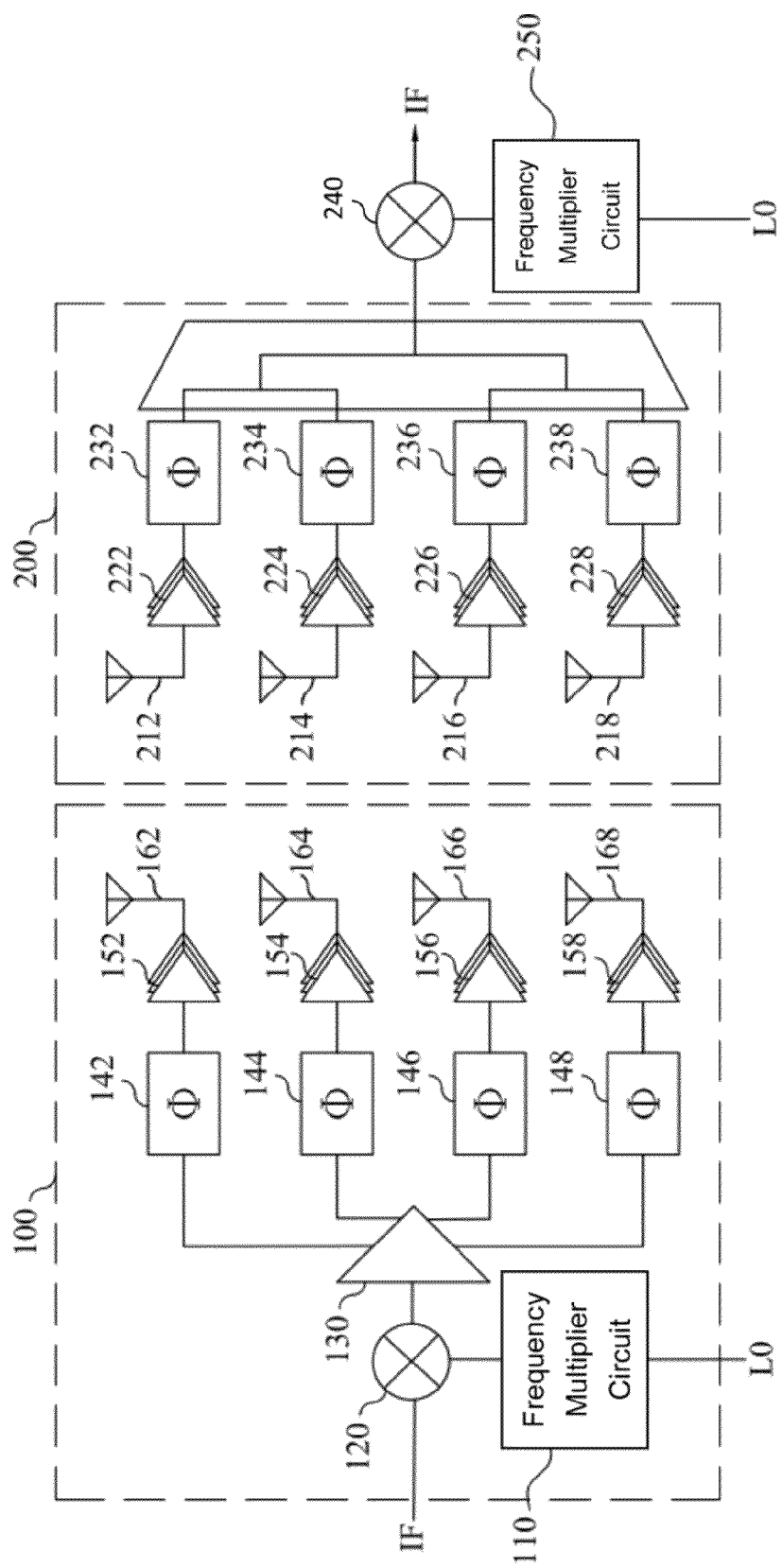
FIG. 1 is a schematic diagram of a radio frequency transceiver according to embodiments of the present invention.

In accordance with common practice, the various described features/elements are not drawn to scale but instead are drawn to best illustrate specific features/elements relevant to the present invention. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular.

FIG. 1 is a schematic diagram of a radio frequency transceiver according to embodiments of the present invention. As shown in FIG. 1, the radio frequency transceiver includes a radio frequency transmitting device 100 and a radio frequency receiving device 200. The radio frequency transmitting device 100 includes a frequency multiplier circuit 110, a mixer circuit 120, a power splitter 130, a plurality of phase shifting circuits 142~148, a plurality of amplifiers 152~158, and a plurality of antennas 162~168. The radio frequency receiving device 200 includes a plurality of antennas 212~218, a plurality of variable gain low noise amplifiers 222~228, a plurality of phase shifting circuits 232~238, a mixer circuit 240, and a frequency multiplier circuit 250. In one embodiment, the radio frequency transceiver in FIG. 1 can be used to transmit and receive millimeter waves. As such, the radio frequency transceiver can be named as a millimeter wave phase array transceiver.

Reference is now made to the radio frequency transmitting device 100, the frequency multiplier circuit 110 is configured to amplify a frequency of a fundamental signal (for example: a local oscillation signal L0) to generate a harmonic signal. The mixer circuit 120 is configured to be electrically coupled to the frequency multiplier circuit 110, and configured to generate a radio frequency signal according to an input signal (for example: intermediate frequency signal, IF) and the harmonic signal. The power splitter 130 is configured to be electrically coupled to the mixer circuit 120, and configured to generate a plurality of sub-radio-frequency signals according to the radio frequency signal. The phase shifting circuits 142~148 are configured to be electrically coupled to the power splitter 130, and configured to shift phases of the sub-radio-frequency signals respectively. The amplifiers 152~158 are configured to be electrically coupled to the phase shifting circuits 142~148 respectively, and configured to amplify the sub-radio-frequency signals respectively to generate a plurality of radio frequency signals. The antennas 162~168 are configured to be electrically coupled to the amplifiers 152~158, and configured to transmit the radio frequency signals respectively.

With respect to the radio frequency receiving device 200, the antennas 212~218 are configured to receive the radio frequency signals transmitted from the radio frequency transmitting device 100. The variable gain low noise amplifiers 222~228 are configured to be electrically coupled to the antennas 212~218 respectively, and configured to amplify the radio frequency signals respectively. The phase shifting circuits 232~238 are configured to be electrically coupled to the variable gain low noise amplifiers 222~228 respectively, and configured to shift phases of the radio frequency signals respectively. On the other hands, the frequency multiplier circuit 250 is configured to amplify a frequency of a fundamental signal (for example: local oscillation signal L0) to generate a harmonic signal. In addition, the mixer circuit 240 is configured to be electrically coupled to the phase shifting circuits 232~238 and the frequency multiplier circuit 250, and configured to generate an output signal (for example: intermediate frequency signal IF) according to the radio frequency signals and the harmonic signal.

Figure 2:
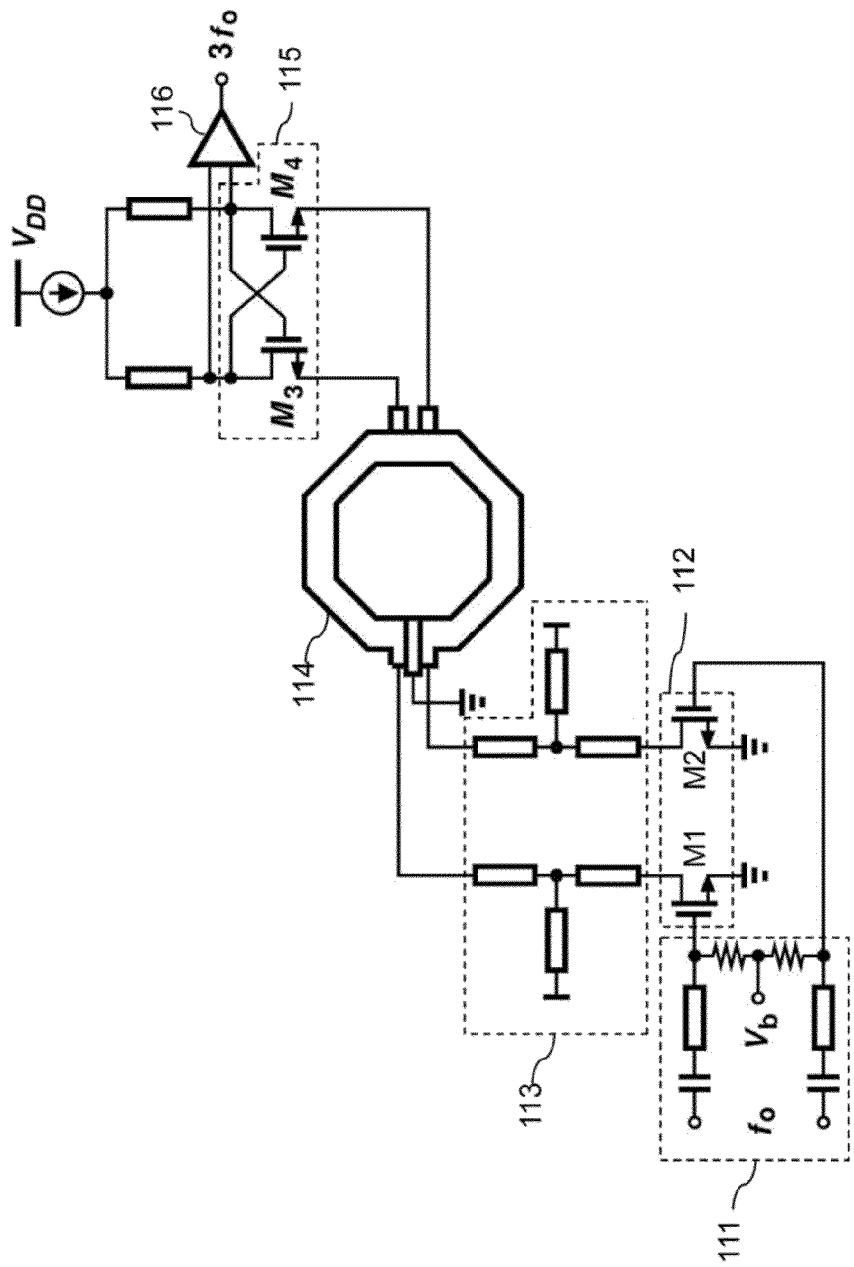
FIG. 2 is a schematic diagram of a frequency multiplier circuit of the radio frequency transmitting device in FIG. 1 according to embodiments of the present invention.

FIG. 2 is a schematic diagram of frequency multiplier circuits 110, 250 of the radio frequency transmitting device 100 in FIG. 1 according to embodiments of the present invention. A 94 GHz frequency multiplier (for example, a frequency tripler) in a conventional radio frequency transmitting device must provide large output swing and wide operation range. For achieving the above-mentioned goal, conventional approaches use capacitor arrays or varactors to extend the resonance frequency of the frequency multiplier. However, conventional approaches limit the output swing of the frequency multiplier significantly.

Therefore, the present invention provides a frequency multiplier circuit as shown in FIG. 2 for solving the above-mentioned problems. The frequency multiplier circuit at least includes an input stage 111, a pseudo-differential pair 112, a matcher 113, a converter 114, a resonating state 115, and an output state 116. When implementing the present invention, the frequency multiplier circuit (for example, frequency multiplier circuits 110, 250 in FIG. 1) can be a 94 GHz injection-locked tripler.

In the embodiment, the input stage 111 receives a fundamental signal $f_o$. The pseudo-differential pair 112 (for example: $M_1$, $M_2$) and the wideband matcher 113 transform the fundamental signal $f_o$ into a 3rd-order harmonic signal $3f_o$. Furthermore, the converter 114 couples the 3rd-order harmonic signal $3f_o$ to the resonating state 115 (for example: a cross-coupled pair $M_3$, $M_4$), and the resonating state 115 amplifies and outputs the 3rd-order harmonic signal $3f_o$. The coupling factor of the converter 114 at 94 GHz frequency is about 0.8. Moreover, the resonance loading of the resonating state 115 also filters out fundamental coupling. Since parasitic of the pseudo-differential pair 112 are absorbed into the matcher 113 herein such that more 3rd-order harmonic signal $3f_o$ power can be injection into the resonating state 115. In addition, the converter 114 can be a transformer. Using a transformer to couple signals can enhance a first order and second order harmonic insulation properties. In addition, the pseudo-differential pair 112 is configured to be electrically coupled to the input stage 111. The matcher 113 is configured to be electrically coupled to the pseudo-differential pair 112. The converter 114 is configured to be electrically coupled to the matcher 113. The resonating state 115 is configured to be electrically coupled to the converter 114.

Figure 3A:
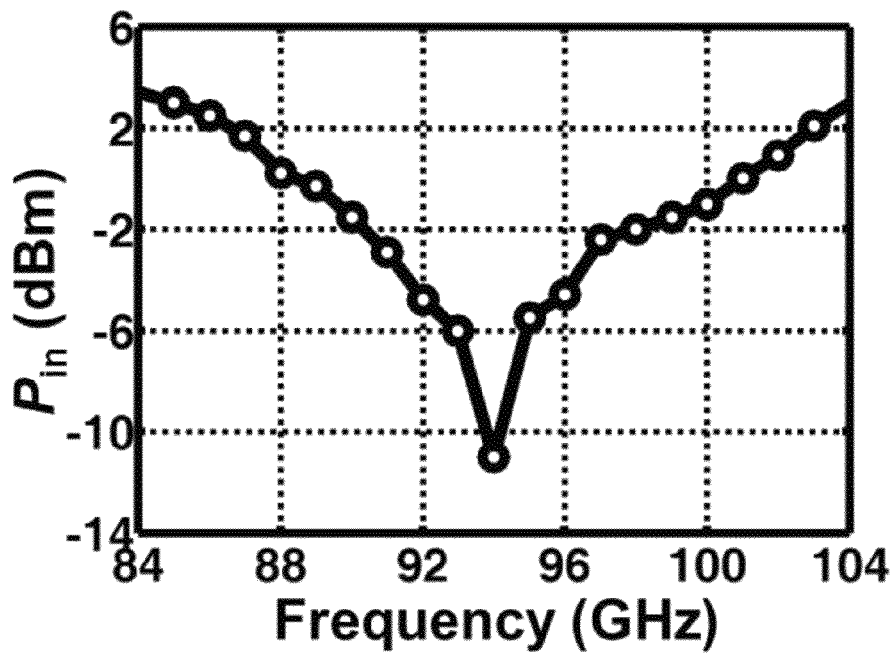
FIG. 3A is a schematic diagram of experimental data of the frequency multiplier circuit in FIG. 2 according to embodiments of the present invention.
Figure 3B:
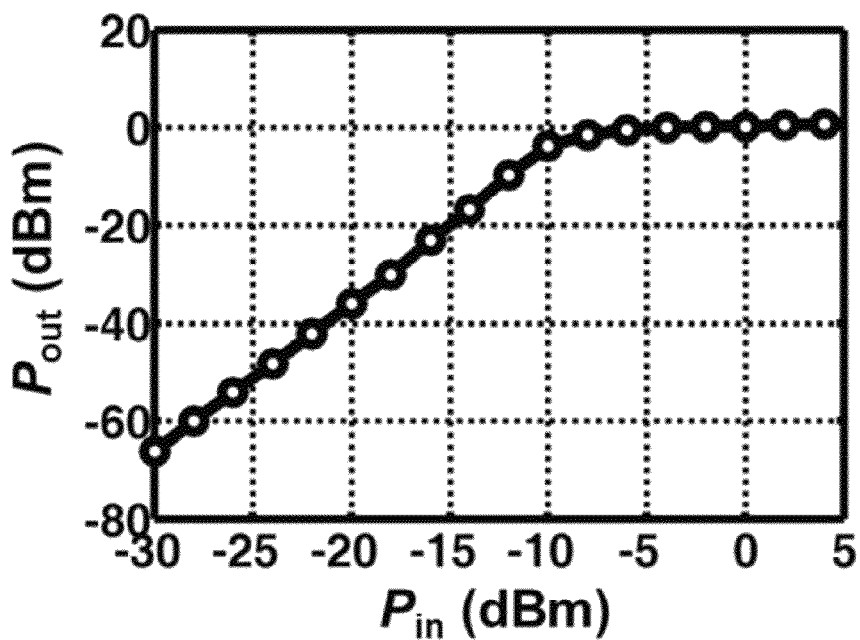
FIG. 3B is a schematic diagram of experimental data of the frequency multiplier circuit in FIG. 2 according to embodiments of the present invention.

FIG. 3A~3B are schematic diagrams of experimental data of the frequency multiplier circuit in FIG. 2 according to embodiments of the present invention. The frequency multiplier circuit of the present invention can enhance its injection range significantly due to wideband matching and coupling manner of the converter 114. As shown in FIG. 3A, when $P_{in}$ is 0 dBm, the lock range is about 13 GHz. Such lock range is much wider than a lock range provided by frequency multiplier circuits of conventional radio frequency transmitting devices. In addition, the frequency multiplier circuit operates at $P_{out} \approx 0$ dBm (when $P_{in} = 0$ dBm), which lasts from 88 GHz to 96 GHz with less than 1 dB degradation. Furthermore, the fundamental and 2nd-order rejections are greater than 35 and 25 dB, respectively.

Figure 4:
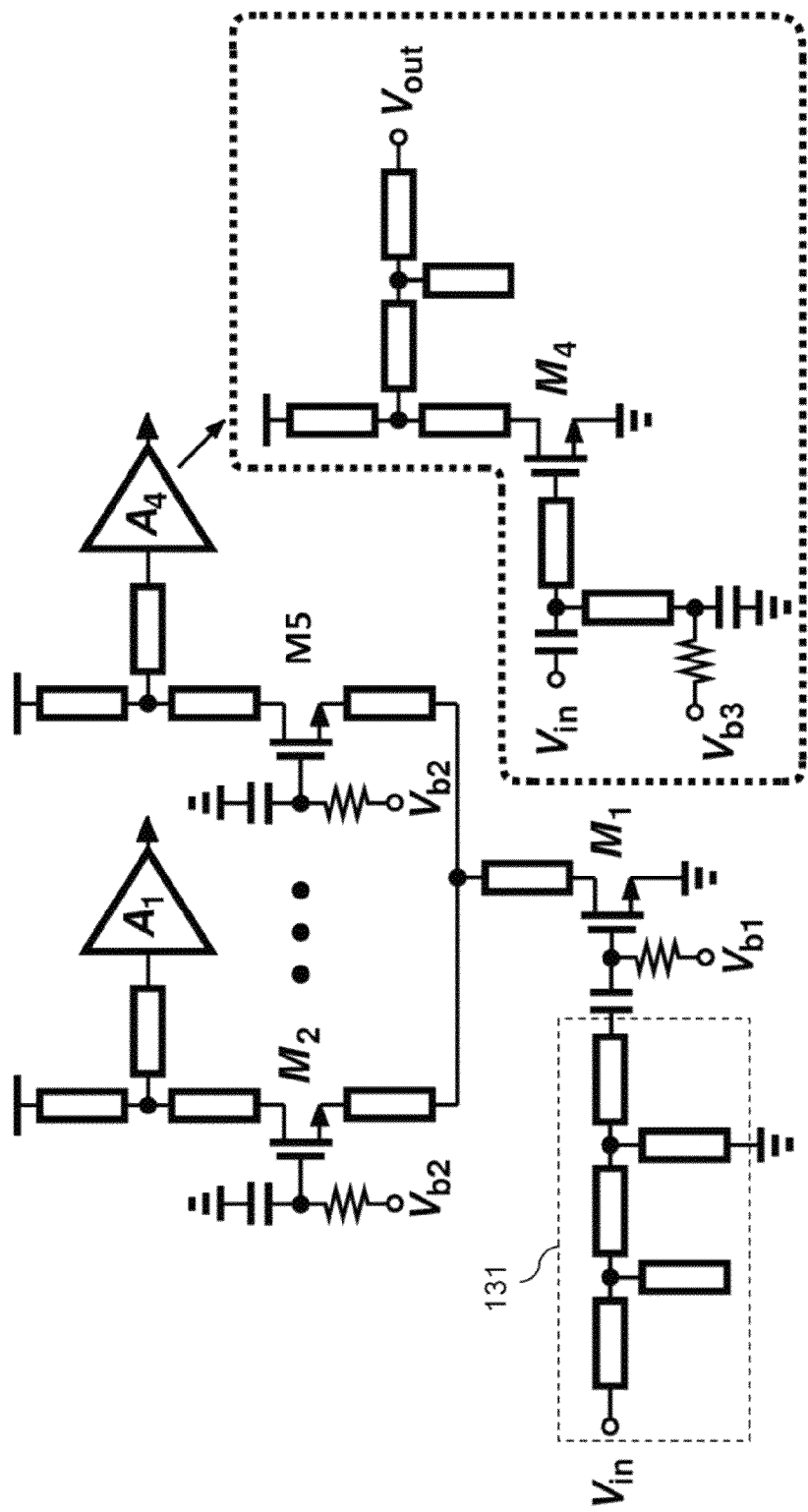
FIG. 4 is a schematic diagram of a power splitter of the radio frequency transmitting device in FIG. 1 according to embodiments of the present invention.

FIG. 4 is a schematic diagram of the power splitter 130 of the radio frequency transmitting device 100 in FIG. 1 according to embodiments of the present invention. At 60 GHz, a passive splitter is still quite big in size. In addition, subsequent amplifiers for signal power compensation also occupy significant area, which makes the overall chip very large.

Therefore, the present invention provides the power splitter 130 as shown in FIG. 4 to solve the above-mentioned problems. The power splitter 130 is a power splitter with CMOS design and 1:4 active power divisions. As shown in FIG. 4, after the input signal $V_{in}$ is processed by 50Ω matcher 131, the input signal $V_{in}$ is transformed into current mode by means of the common-source amplifier $M_1$. In addition, four equally-distributed currents are applied into four common-gate amplifiers $M_2$~$M_5$ with proper matching. Common-source amplifiers A1~A4 are placed right after the common-gate amplifiers $M_2$~$M_5$ to both compensate for loss and improve linearity. Due to the very little reverse gain of common-gate amplifiers $M_2$~$M_5$, the power splitter 130 achieves a port to port isolation of 30 dB. In view of above, the present invention provides the power splitter 130 to enhance gain of each loop and reduce power consumption and area of a system. In addition, the common-gate amplifiers $M_2$~$M_5$ are connected between a common node and a power source in parallel. The foregoing common node is electrically coupled to the common-source amplifier $M_1$. The common-source amplifiers $A_1$~$A_4$ are electrically coupled to the common-gate amplifiers $M_2$~$M_5$ respectively. The matcher 131 is configured to be electrically coupled to the common-source amplifier $M_1$.

Figure 5A:
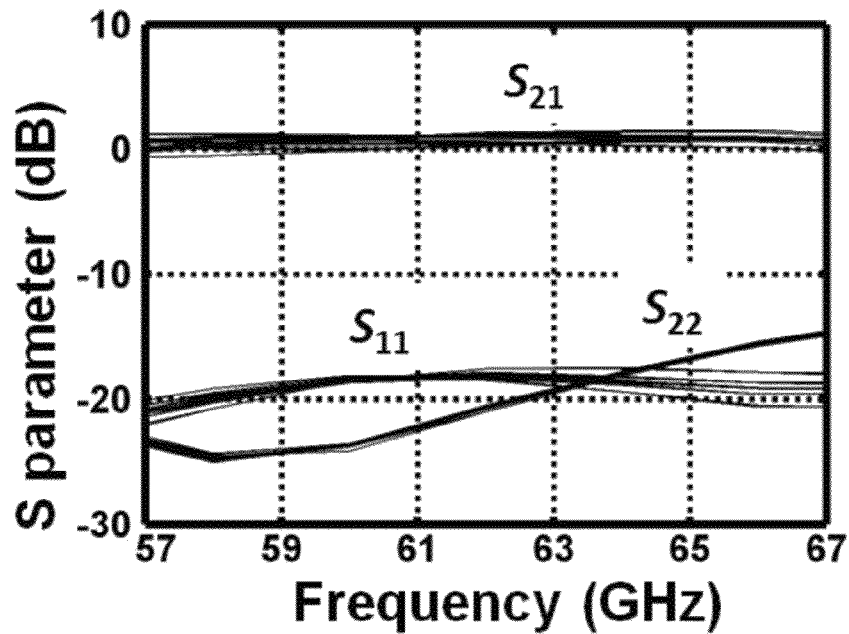
FIG. 5A is a schematic diagram of a gain and phase errors of the power splitter in FIG. 4 according to embodiments of the present invention.
Figure 5B:
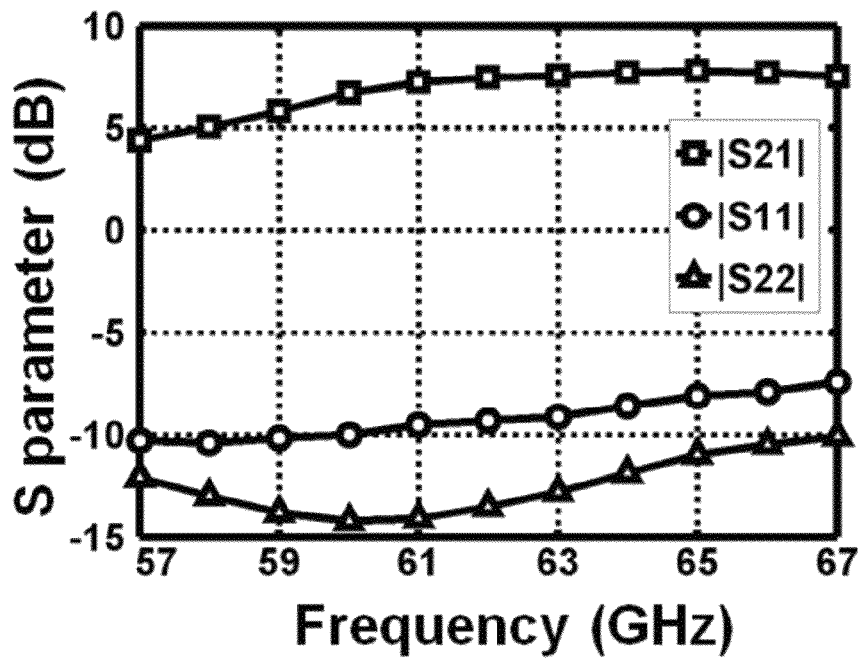
FIG. 5B is a schematic diagram of a small signal measurement of the power splitter in FIG. 4 according to embodiments of the present invention.

FIG. 5A is a schematic diagram of a gain and phase errors of the power splitter 130 in FIG. 4 according to embodiments of the present invention. As shown in FIG. 5A, the maximum deviations of the power splitter 130 are only 0.05 dB and 0.2 degrees. FIG. 5B is a schematic diagram of a small signal measurement of the power splitter 130 in FIG. 4 according to embodiments of the present invention. As shown in FIG. 5B, it presents frequency responses of the power splitter 130 at 57 GHz~67 GHz frequency band. It is noted that, due to the above result, even if the power splitter 130 splits signals into four loops, the power splitter 130 still can provide a gain greater than 5 dB and a fine matching relationship. Besides, as can be seen in FIG. 5B, the peak gain of the small signal of the power splitter 130 reaches 7.7 dB, and $S_{11}$ and $S_{22}$ are less than ~−8 and ~−10 dB, respectively.

Figure 6:
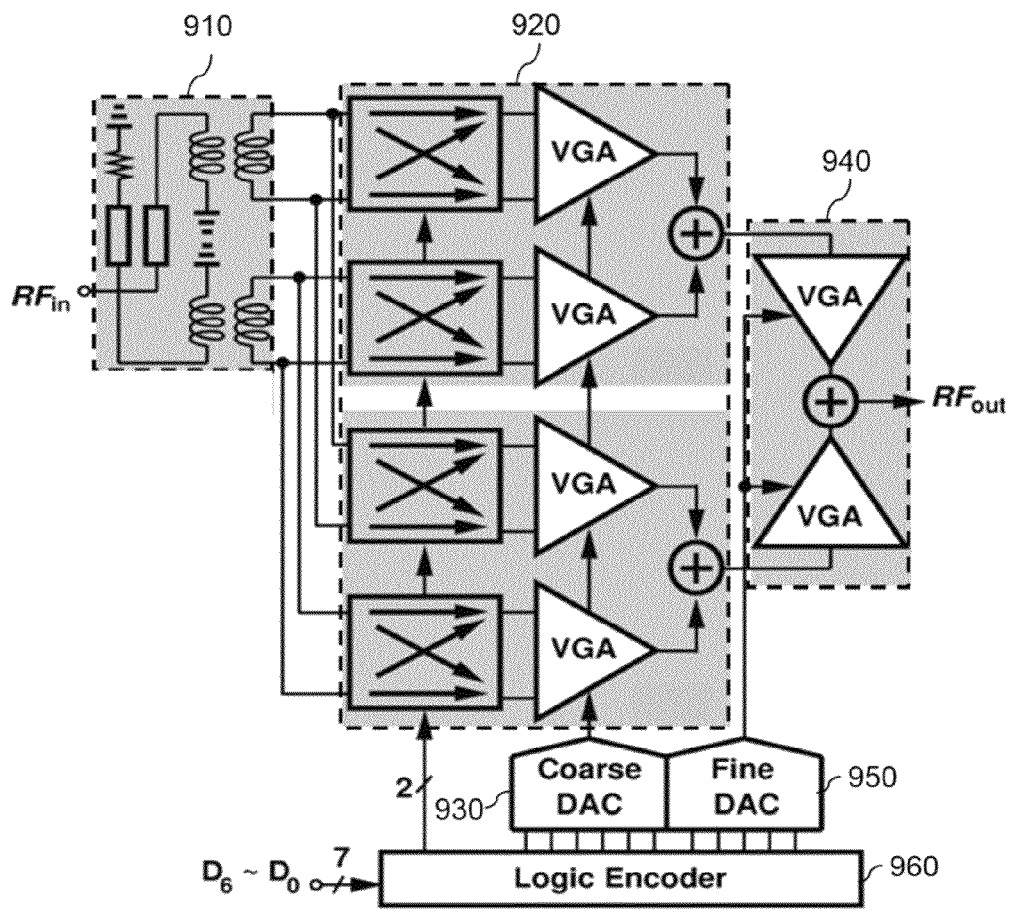
FIG. 6 is a schematic diagram of a phase shifting circuit of the radio frequency transceiver in FIG. 1 according to embodiments of the present invention.

FIG. 6 is a schematic diagram of phase shifting circuits 142~148 of the radio frequency transmitting device 100 in FIG. 1 according to embodiments of the present invention. Generally, the phase shifting circuits 142~148 can be two-step phase interpolation device. An input signal $RF_{in}$ is processed by a vector generator 910 to generate differential quadrature signals, and two groups of phase selector 920 are used to generate two signals whose phases are adjacent to each other. Subsequently, the phase selector 940 is used to adjust a ratio among two phases to generate a final signal.

In one embodiment, the phase shifting circuit is a 94 GHz 7-bit phase shifting circuit. As shown in FIG. 6, the vector generator 910 converts the radio frequency input $RF_{in}$ into differential quadrature signals. The differential quadrature signals are parallelized into the phase selector 920. The phase selector 920 is driven by a coarse DAC 930 with three current sources scaled as 2:5:7 and three switches for control, allowing 16 phase states with resolution of 22.5 degree.

Furthermore, the phase selector 940 further processes outputs generated by the phase selector 920. The phase selector 940 driven by a fine DAC 950 with five current sources synthesizes another 3-bit fine phase states. Moreover, the logic encoder 960 is implemented with static CMOS gates such that the logic encoder 960 can adopt 7-bit binary codes to control elements in the phase shifter circuits 142~148. The resolution of outputs of the phase selector 940 can be 2.8 degrees by the control of the fine DAC 950 and the logic encoder 960.

Conventional phase shifting circuits with one-step interpolation design need a very high resolution DAC. As such, manufacturing processes of conventional phase shifting circuits will be complex. In contrast to conventional phase shifting circuits, the phase shifting circuits 142~148 of the present invention adopt two-step phase interpolation technique. Hence, the phase shifting circuits 142~148 merely need to use low resolution DAC to perform fine phase shift to an input. In addition, the vector generator 910 includes a coupler and at least two baluns. The phase selector 920 is configured to be electrically coupled to the coupler and the at least two baluns. The coarse DAC 930 is configured to be electrically coupled to the phase selector 920. The phase selector 940 is configured to be electrically coupled to the phase selector 920. The fine DAC 950 is configured to be electrically coupled to the phase selector 940. The logic encoder 960 is configured to be electrically coupled to the coarse DAC 930 and the fine DAC 950.

Figure 7:
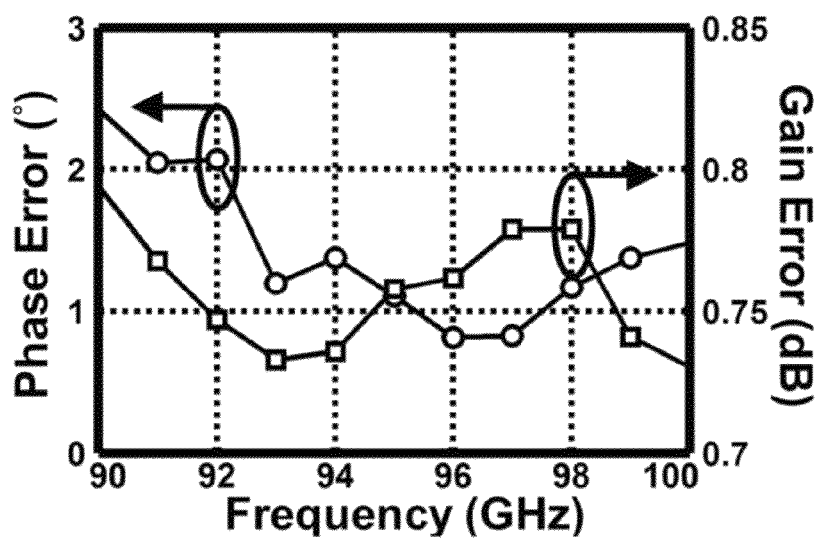
FIG. 7 is a schematic diagram of experimental data of the phase shifting circuit in FIG. 6 according to embodiments of the present invention.

FIG. 7 is a schematic diagram of experimental data of the phase shifting circuits 142~148 in FIG. 6 according to embodiments of the present invention. As shown in FIG. 7, during 90~100 GHz, a phase and a gain error of the phase shifting circuits 142~148 is 2.5 degrees and 0.8 dB respectively. In addition, a phase and a gain error of the phase shifter circuits 142~148 at 94 GHz is 1.4 degrees and 0.73 dB respectively.

Figure 8:
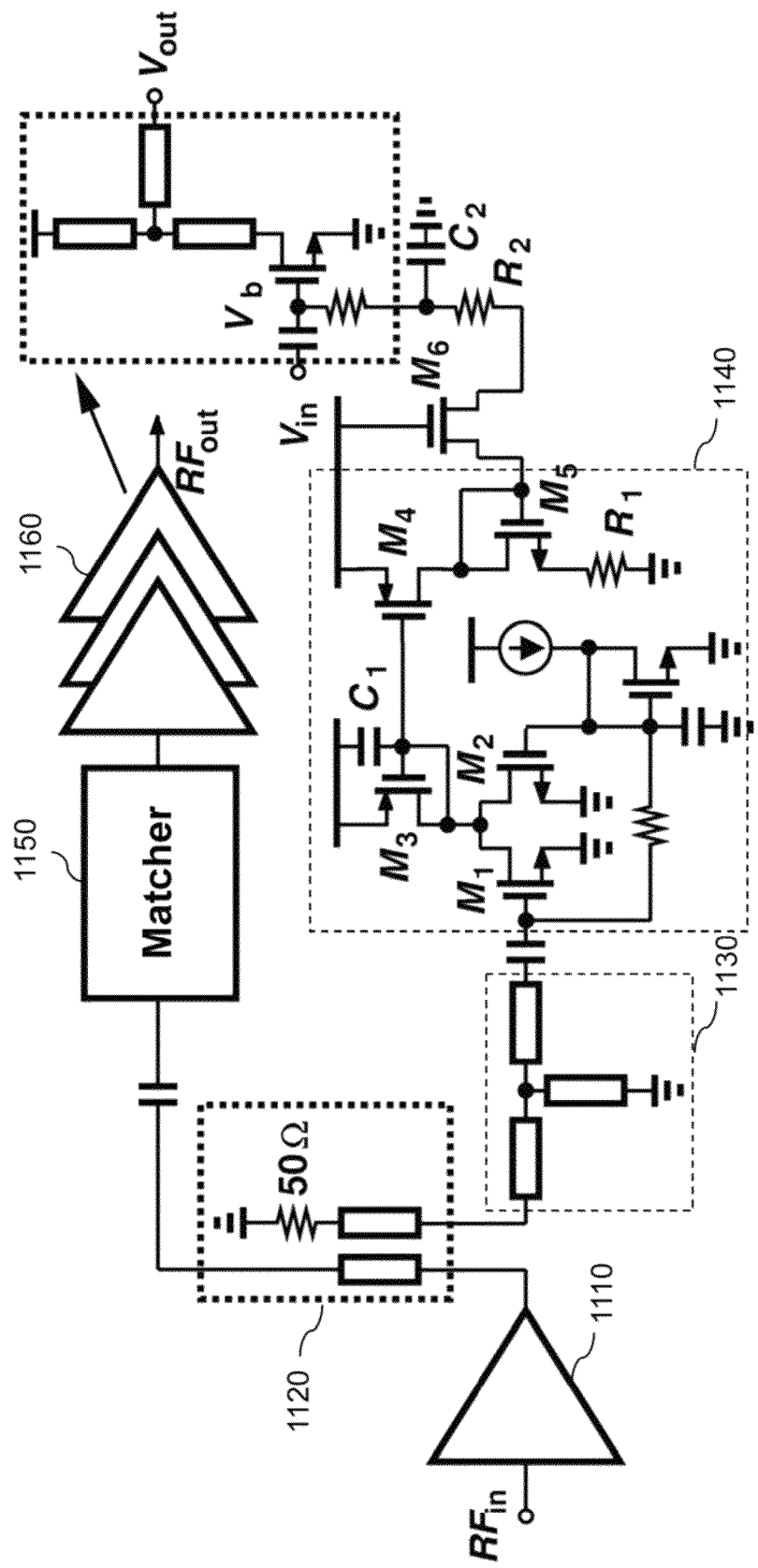
FIG. 8 is a schematic diagram of an amplifier of the radio frequency transmitting device in FIG. 1 according to embodiments of the present invention.

FIG. 8 is a schematic diagram of amplifiers 152~158 of the radio frequency transmitting device 100 in FIG. 1 according to embodiments of the present invention. As shown in FIG. 8, the input stage 1110 is configured to receive and amplify the radio frequency signal $RF_{in}$. Subsequently, the coupler 1120 is configured to separate the radio frequency signal $RF_{in}$ into two ways. The coupler 1120 is configured to couple part of power of the radio frequency signal $RF_{in}$ (for example, 25% of power of the radio frequency signal $RF_{in}$) to the power detector 1140. The power detector 1140 is configured to detect the radio frequency signal to output a detection signal. In addition, the coupler 1120 is configured to couple bulk of power of the radio frequency signal $RF_{in}$ to the matcher 1150. The matcher 1150 performs an impedance matching process to the radio frequency signal $RF_{in}$ and transmits the radio frequency signal $RF_{in}$ to a plurality of amplifiers 1160. The amplifiers herein can be three-stage common-source amplifiers, and the three-stage common-source amplifiers are used to amplify the radio frequency signal $RF_{in}$. In addition, the coupler 1120 is configured to be electrically coupled to the input stage 1110. The amplifiers 1160 are connected to each other in series and electrically coupled to the coupler 1120. The matcher 1130 is configured to be electrically coupled between the coupler 1120 and the power detector 1140. The matcher 1150 is configured to be electrically coupled between the coupler 1120 and the amplifiers 1160.

Specifically, after the 50Ω matcher 1130 performs an impedance matching process to the radio frequency signal $RF_{in}$, the transistor $M_1$ converts the radio frequency signal $RF_{in}$ power into current mode, while the transistor $M_2$ produces a small quiescent current. The current is therefore transferred into proper voltage level by means of transistors $M_3$-$M_5$ and resistor $R_1$ thereby generating the detection signal. Moreover, if the radio frequency signal $RF_{in}$ is small, the currents of transistors $M_1$, $M_2$ are small. The power detector 1140 uses its current mirror $M_3$ to copy the current to the transistor $M_4$. Subsequently, the power detector 1140 uses its resistor $R_1$ and transistor $M_5$ to generate a small voltage Vb. If the radio frequency signal $RF_{in}$ becomes larger, the current which flows through the current mirror $M_3$ of the power detector 1140 becomes larger correspondingly. Accordingly, the voltage across the resistor $R_1$ becomes larger relatively thereby enhancing the voltage Vb. As such, when the radio frequency signal $RF_{in}$ is small, the voltage Vb is correspondingly low, and therefore, the power consumption is low. The above-mentioned adaptive biasing mechanism lets the power detector 1140 perform its best efficiency in different input power.

Figure 9A:
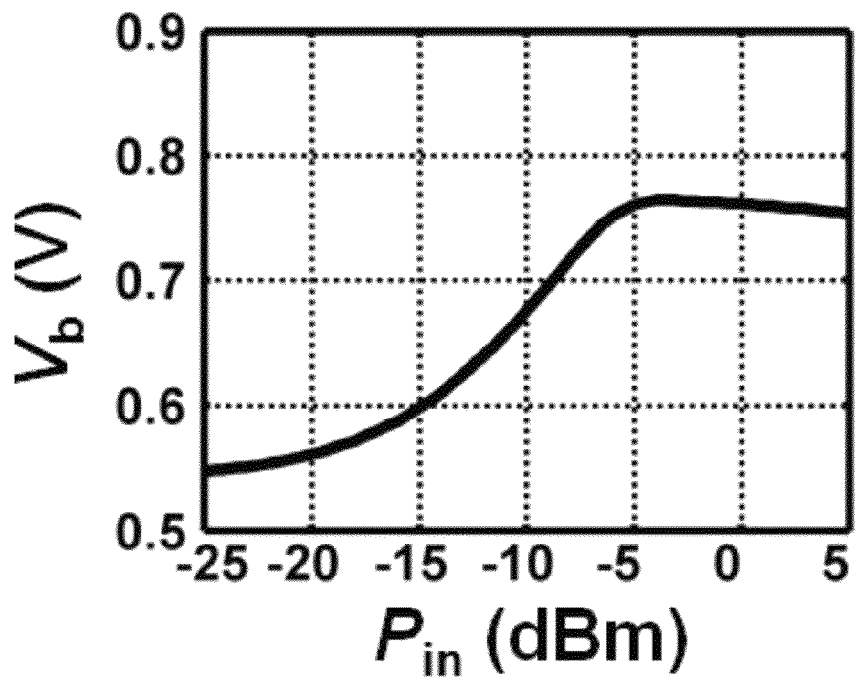
FIG. 9A is a schematic diagram of experimental data of the amplifier in FIG. 8 according to embodiments of the present invention.
Figure 9B:
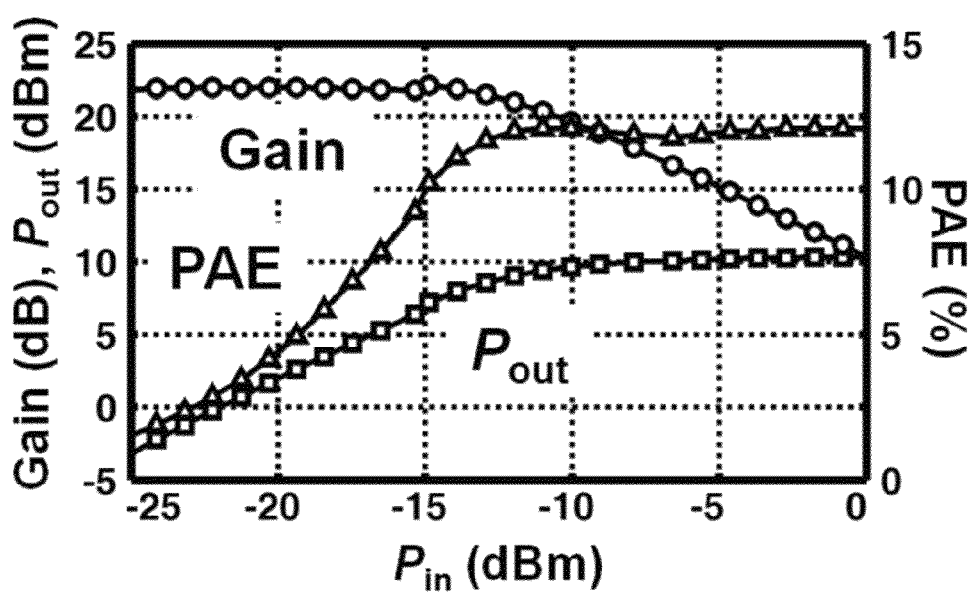
FIG. 9B is a schematic diagram of experimental data of the amplifier in FIG. 8 according to embodiments of the present invention.
Figure 9C:
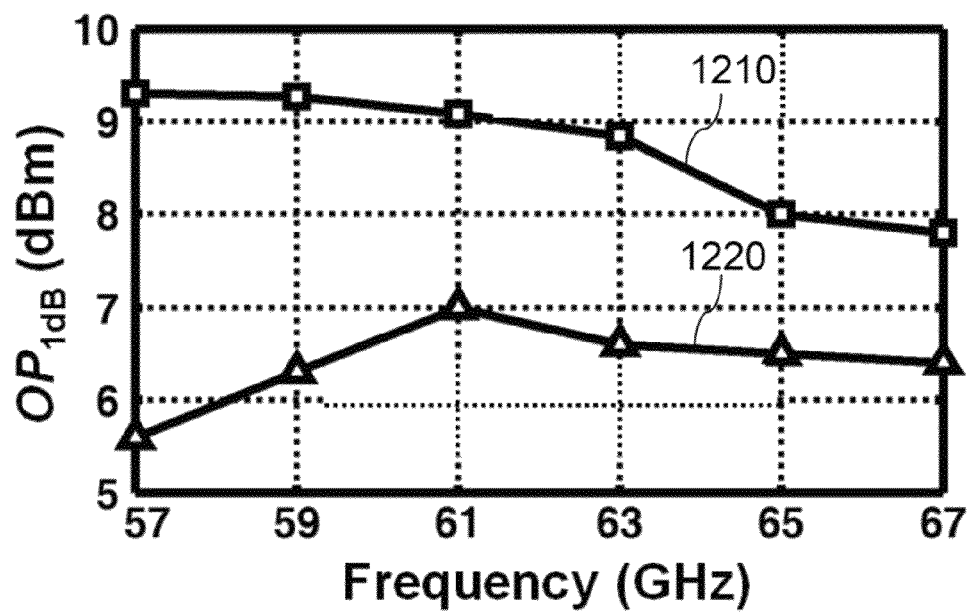
FIG. 9C is a schematic diagram of experimental data of the amplifier in FIG. 8 according to embodiments of the present invention.

FIG. 9A~9C are schematic diagrams of experimental data of the amplifiers 152~158 in FIG. 8 according to embodiments of the present invention. Referring to FIG. 9A, when the bias Vb of the amplifiers 152~158 is higher than a specific voltage (for example: about 0.8 V), the output power does not increase significantly whereas the DS power does raise dramatically. As a result, the amplifiers 152~158 further include a voltage-clamping transistor $M_6$ for limiting the highest Vb to around 0.8V according to the detection signal generated by the power detector 1140. Subsequently, the amplifiers 1160 amplify power of the radio frequency signal according to bias Vb. Furthermore, the amplifiers 152~158 further include a low-pass filter (for example: 1/gm3 and C1, R2 and C2) to stabilize power detection.

In the embodiment, the amplifiers 152~158 can dynamically adjust bias Vb based on the input radio frequency power. As such, since bias Vb will be increased in the gain compression region, linearity of the amplifiers 152~158 is expected to be improved as well. In other words, AM-to-AM distortion can be minimized. As compared with conventional amplifier with feedback biasing control, the present invention with feedforward approach achieves better power efficiency. The conventional amplifier with feedback biasing control must take part of the output to the power detector. However, the amplifier of the present invention uses all-analog adaptive biasing technique, and therefore, the amplifier of the present invention does not need any data converter and digital logic. The amplifier of the present invention dissipates 30 mW (when $P_{in} \cong 15$ dBm) from a 1V supply, presenting a gain of 22 dB, $S_{11} < 8$ dB and $S_{22} < 11$ dB for the frequency band 57~66 GHz.

Reference is now made to FIG. 9B, it presents the power added efficiency, (PAE) of the amplifiers 152~158 of the present invention. The PAE stays at 12% from $P_{in} \cong 13$ dBm all the way to $P_{in} > 0$ dBm. Compared with conventional amplifier with CMOS whose PAE is 4%, the PAEs of the amplifiers 152~158 of the present invention increase significantly. In addition, the PAEs of the amplifiers 152~158 of the present invention at $OP_{1dB}$ (=9.2 dBm) and $OP_{1dB}$ back off 6 dB are 12.1% and 6.5%, respectively. Furthermore, referring to FIG. 9C, the curve marked as 1210 is a result of the amplifier of the present invention with adaptive bias technology, and the curve marked as 1220 is a result of the amplifier of the present invention without adaptive bias technology. As shown in FIG. 9C, when the amplifier of the present invention uses adaptive bias technology, its $OP_{1dB}$ can be improved by about 1.5 to 3.7 dB.

Figure 10:
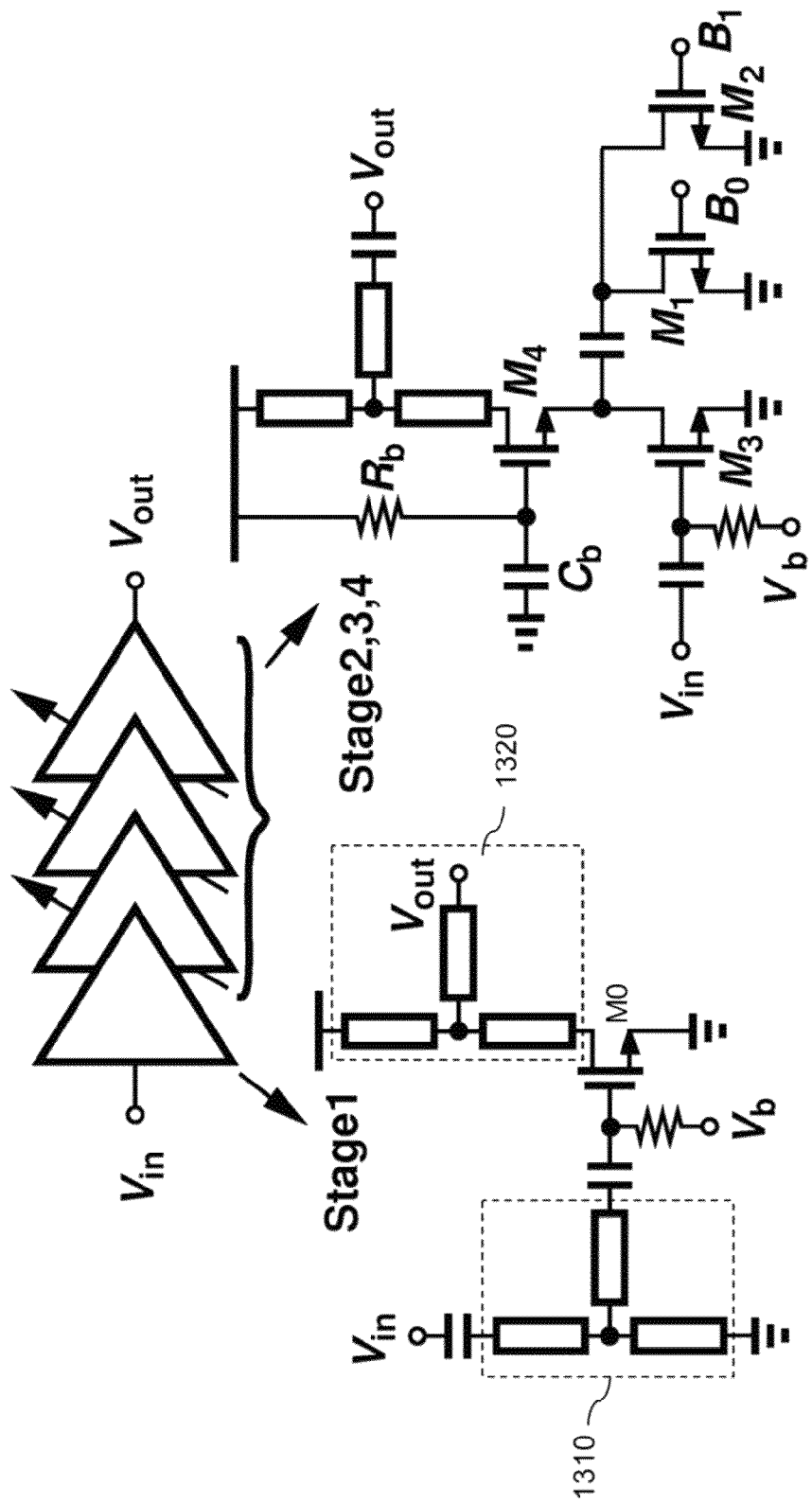
FIG. 10 is a schematic diagram of a variable gain low noise amplifier of the radio frequency receiving device in FIG. 1 according to embodiments of the present invention.

FIG. 10 is a schematic diagram of variable gain low noise amplifiers 222~228 of the radio frequency receiving device 200 in FIG. 1 according to embodiments of the present invention. Traditional gain control techniques such as bias tuning or current steering suffer from matching and linearity issues, respectively. As shown in FIG. 10, the present invention provides variable gain low noise amplifiers 222~228 to solve the above-mentioned problem. First of all, the input stage (stage1) is configured to filter noise of the radio frequency signal. Subsequently, the subsequent cascade stages (stage2~4) provide gain tuning.

Specifically, the input stage includes a matcher 1310, a common-source transistor $M_0$, and a matcher 1320. The matcher 1310 is used to perform an impedance matching process. The common-source transistor $M_0$ is configured to generate an output signal according to an input signal and bias Vb. The matcher 1320 is configured to perform an impedance matching process with variable gain amplifiers. In addition, the common-source transistor $M_0$ is configured to be electrically coupled to the matcher 1310. The matcher 1320 is configured to be electrically coupled to the common-source transistor $M_0$.

Moreover, each of the variable gain amplifiers includes a plurality of transistors for providing multi-level gain control so as to amplify power of the input radio frequency signal. Turning on transistors $M_1$ or $M_2$ would short certain amount of radio frequency current into ground according to a control signal, and thus decrease the gain. Since these transistors are AC coupled, the bias point of the transistor $M_3$ and the frequency response remain unchanged for different gain levels. The on-resistances of the switches are carefully designed such that the 7 gain levels are evenly distributed with an overall tuning range >23 dB.

Furthermore, owing to a relatively constant output $P_{1dB}$ of the variable gain low noise amplifiers 222~228, the input $P_{1dB}$ ($IP_{1dB}$) herein increases by at least 11 dB from high gain to low gain mode. Current-steering variable gain low noise amplifiers (VGLNAs), on the contrary, do not present such a good feature.

Figure 11A:
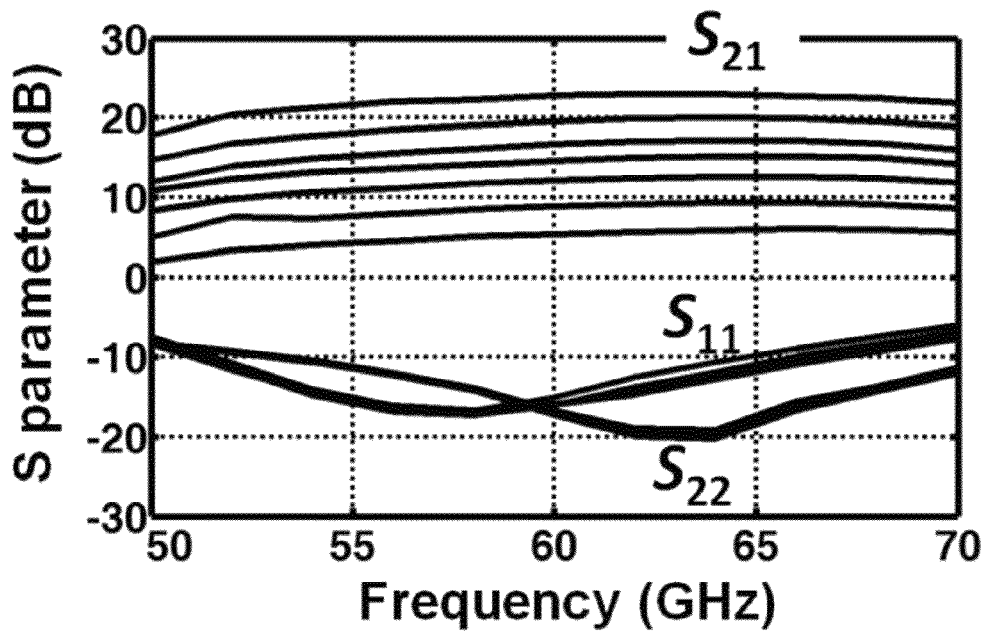
FIG. 11A is a schematic diagram of experimental data of the variable gain low noise amplifier in FIG. 10 according to embodiments of the present invention.
Figure 11B:
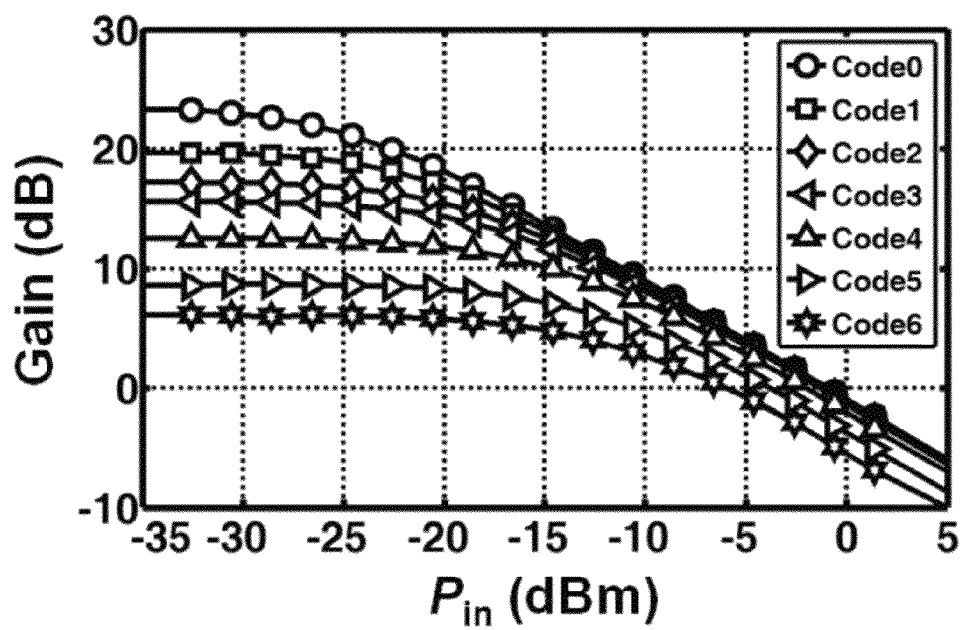
FIG. 11B is a schematic diagram of experimental data of the variable gain low noise amplifier in FIG. 10 according to embodiments of the present invention.

FIG. 11A~11B are schematic diagrams of experimental data of the variable gain low noise amplifiers 222~228 in FIG. 10 according to embodiments of the present invention. As shown in FIG. 11A, multi-level gain parameter $S_{21}$ are uniformly spread between 23.5 and 6 dB, and parameters $S_{11}$ and $S_{22}$ are less than ~10 dB and ~12 dB respectively. FIG. 11B shows the gain compression measurement at 60 GHz from maximum gain state (code0) to minimum gain state (code6). The input $P_{1dB}$ is improved from ~27.8 dBm to ~15 dBm.

In addition, the phase shifting circuits 232~238 of the radio frequency receiving device 200 can be realized by the phase shifting circuit in FIG. 6. For the sake of brevity, the detailed description of the phase shifting circuits 232~238 of the radio frequency receiving device 200 is omitted herein.

In view of the above embodiments of the present disclosure, it is apparent that the application of the present invention has the advantages as follows. The present invention provides a radio frequency transmitting device with higher output power and efficiency. In addition, the present invention provides a radio frequency receiving device whose linearity and noise index are improved efficiently. Furthermore, phase shifting circuits with two-step phase interpolation technique provided by the present invention can generate high resolution phase shift value, and therefore, the resolution of the antenna radiate pattern of the whole system can be enhanced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A radio frequency transmitting device, comprising:
   a frequency multiplier circuit configured to amplify a frequency of a fundamental signal to generate a harmonic signal;
   a mixer circuit configured to be electrically coupled to the frequency multiplier circuit, and configured to generate a radio frequency signal according to an input signal and the harmonic signal;
   a power splitter configured to be electrically coupled to the mixer circuit, and configured to generate a plurality of sub-radio-frequency signals according to the radio frequency signal, wherein the power splitter comprises:
      a first amplifier;
      a plurality of second amplifiers configured to be connected between a common node and a power source in parallel, wherein the common node is electrically coupled to the first amplifier, and
      a plurality of third amplifiers configured to be electrically coupled to the second amplifiers respectively;
   a plurality of phase shifting circuits configured to shift phases of the sub-radio-frequency signals respectively;
   a plurality of amplifiers configured to amplify power of the sub-radio-frequency signals respectively, wherein each of the amplifiers comprises:
      an input stage configured to receive the sub-radio-frequency signal;
      a first coupler configured to be electrically coupled to the input stage;
      a plurality of fourth amplifiers, wherein the fourth amplifiers are connected to each other in series and electrically coupled to the first coupler, wherein the first coupler is configured to couple part of power of the sub-radio-frequency signal to the fourth amplifiers, and the fourth amplifiers are configured to amplify power of the sub-radio-frequency signal according to a bias;
      a power detector configured to be electrically coupled to the first coupler, wherein the first coupler is configured to couple part of power of the sub-radio-frequency signal to the power detector, and the power detector is configured to detect the sub-radio-frequency signal to output a detection signal; and
      a voltage clamper configured to be electrically coupled to the power detector, and configured to control the bias according to the detection signal; and
   a plurality of antennas configured to transmit the sub-radio-frequency signals.

2. The radio frequency transmitting device of claim 1, wherein each of the amplifiers comprises:
   a first matcher configured to be electrically coupled between the first coupler and the power detector; and
   a second matcher configured to be electrically coupled between the first coupler and the fourth amplifiers.

3. The radio frequency transmitting device of claim 1, wherein the frequency multiplier circuit is a frequency tripler, wherein the frequency tripler comprises:
   an input stage;
   a pseudo-differential pair configured to be electrically coupled to the input stage;
   a matcher configured to be electrically coupled to the pseudo-differential pair;
   a transformer configured to be electrically coupled to the matcher;
   a resonating state configured to be electrically coupled to the transformer; and
   an output state.

4. The radio frequency transmitting device of claim 1, wherein the power splitter comprises:
   a matcher configured to be electrically coupled to the first amplifier.

5. The radio frequency transmitting device of claim 1, wherein the first amplifier is a common-source amplifier, the second amplifiers are common-gate amplifiers, the third amplifiers are common-source amplifiers, and the fourth amplifiers are common-source amplifiers.

6. The radio frequency transmitting device of claim 1, wherein the phase shifting circuit comprises:
a second coupler and at least two baluns;
at least two first phase selectors configured to be electrically coupled to the second coupler and the at least two baluns;
a first digital to analog converter configured to be electrically coupled to the first phase selectors;
a second phase selector configured to be electrically coupled to the first phase selectors;
a second digital to analog converter configured to be electrically coupled to the second phase selector; and
a logic encoder configured to be electrically coupled to the first digital to analog converter and the second digital to analog converter.

7. A radio frequency receiving device, comprising:
a plurality of antennas configured to receive a plurality of radio frequency signals;
a plurality of variable gain low noise amplifiers configured to be electrically coupled to the antennas, and configured to amplify the radio frequency signals, wherein each of the variable gain low noise amplifiers comprises:
an input stage configured to filter noise of the radio frequency signals; and
a plurality of variable gain amplifiers, wherein the variable gain amplifiers are connected to each other in series, and configured to be electrically coupled to the input stage, wherein each of the variable gain amplifiers comprises:
an amplifying unit configured to amplify power of the radio frequency signals; and
a pull down unit configured to be electrically coupled to the amplifying unit, and configured to connect the amplifying unit to ground according to a control signal; and
a plurality of phase shifting circuits configured to be electrically coupled to the variable gain low noise amplifiers respectively, and configured to shift phases of the radio frequency signals;
a frequency multiplier circuit configured to amplify a frequency of a fundamental signal to generate a harmonic signal; and
a mixer circuit configured to be electrically coupled to the phase shifting circuits and the frequency multiplier circuit, and configured to generate an output signal according to the radio frequency signals and the harmonic signal.

8. The radio frequency receiving device of claim 7, wherein the input stage comprises:
a first matcher;
a common-source amplifier configured to be electrically coupled to the first matcher; and
a second matcher configured to be electrically coupled to the common-source amplifier.

9. The radio frequency receiving device of claim 7, wherein the frequency multiplier circuit is a frequency tripler, wherein the frequency tripler comprises:
an input stage;
a pseudo-differential pair configured to be electrically coupled to the input stage;
a matcher configured to be electrically coupled to the pseudo-differential pair;
a transformer configured to be electrically coupled to the matcher;
a resonating state configured to be electrically coupled to the transformer; and
an output state.

10. The radio frequency receiving device of claim 7, wherein the phase shifting circuit comprises:
a coupler and at least two baluns;
at least two first phase selectors configured to be electrically coupled to the coupler and the at least two baluns;
a first digital to analog converter configured to be electrically coupled to the first phase selectors;
a second phase selector configured to be electrically coupled to the first phase selectors;
a second digital to analog converter configured to be electrically coupled to the second phase selector; and
a logic encoder configured to be electrically coupled to the first digital to analog converter and the second digital to analog converter.

* * * * *